United States Patent [19]

Bockelmann

[11] Patent Number: 5,073,732
[45] Date of Patent: Dec. 17, 1991

[54] LIMITER CIRCUIT FOR ALTERNATING VOLTAGES

[75] Inventor: Gerhard-Jürgen Bockelmann, Jersbek, Fed. Rep. of Germany

[73] Assignee: U. S. Philips Corporation, New York, N.Y.

[21] Appl. No.: 603,975

[22] Filed: Oct. 23, 1990

[30] Foreign Application Priority Data

Oct. 27, 1989 [DE] Fed. Rep. of Germany ....... 3935844

[51] Int. Cl.$^5$ ............................................. H03H 11/52
[52] U.S. Cl. ..................................... 307/540; 307/557; 307/561; 307/542; 328/169; 328/171
[58] Field of Search ............... 307/490, 540, 542, 559, 307/562, 567, 561, 318, 547; 379/394, 398; 330/288; 328/171, 169

[56] References Cited

U.S. PATENT DOCUMENTS

| | | | |
|---|---|---|---|
| 4,419,638 | 12/1983 | Johnson | 307/490 |
| 4,445,054 | 4/1984 | Ishii | 307/555 |
| 4,536,662 | 8/1985 | Fujii | 307/262 |
| 4,571,511 | 2/1986 | Dischert et al. | 307/561 |
| 4,804,927 | 2/1989 | Yamakoshi et al. | 330/288 |

Primary Examiner—Timothy P. Callahan
Attorney, Agent, or Firm—Bernard Franzblau

[57] ABSTRACT

A limiter circuit for alternating voltages includes a pair of zener diodes arranged in series but in opposite sense. Each zener diode forms an additional current mirror with a respective further transistor so that for each of the two possible directions of the limiter current it is possible to derive a limiter signal current which is decoupled from the actual limited current and which, unlike the actual limiter current, always flows in the same direction. Such a limiter circuit can be used in the input circuit of a bridge rectifier for ringing-current detection in electronic telephone sets connected to two-wire lines.

15 Claims, 2 Drawing Sheets

LIMITER CIRCUIT FOR ALTERNATING VOLTAGES

BACKGROUND OF THE INVENTION

This invention relates to a limiter circuit for alternating voltages, the circuit comprising a series arrangement of two diode groups, the groups being arranged in opposite sense and each group comprising at least one zener diode.

Such a circuit is known from for example U.S. Pat. No. 4,700,130 and serves for limiting an applied alternating voltage to a fixed value to protect subsequent circuit sections and circuit elements against excessive voltages. In the known circuit this is effected in that, depending on the polarity of the alternating voltage, the zener voltage of one of the zener diodes is exceeded if the instantaneous value of the alternating voltage exceeds the sum of the zener voltage of one of the diodes and the forward voltage of the second diode. In this way the limiter circuit restricts the alternating voltage to this value, the limiter voltage.

In many cases it is desirable to have a signal current which indicates that a limiter current flows in the limiter circuit, i.e. that the applied alternating voltage is limited to the limiter voltage. By means of this signal current it is possible, for example, to bring into effect further protective measures for the circuit sections following the limiter circuit. This signal current should always flow in the same direction and should suitably not be formed directly by the limiter current, which may assume large values under certain conditions.

SUMMARY OF THE INVENTION

It is an object of the invention to modify a limiter circuit of the type defined in the opening paragraph such that, upon activation of the limiter circuit it supplies a signal current which is largely decoupled from the limiter current.

According to the invention this object is achieved in that one diode of each group is constituted by a diode-connected first transistor ($TZ_1$, $TZ_2$), which together with a further transistor ($T_1$, $T_2$) forms a current mirror, the reproduced value of the limiter current flowing through the first transistors forming a limiter signal current ($I_s$) which indicates the flow of a limiter current.

In this way a limiter signal current which is decoupled from the limiter current can be derived.

Further embodiments of the invention are defined in the dependent claims.

It is very advantageous to employ a limiter circuit in accordance with the invention in the alternating voltage input of a full-wave bridge rectifier, in particular if this alternating voltage input is connected to a two-wire telephone line and the limiter voltage of the limiter circuit is selected in such a manner that a limiter signal occurs when a ringing signal appears on the telephone line.

BRIEF DESCRIPTION OF THE DRAWING

Some embodiments of the invention will now be described in more detail, by way of example, with reference to the accompanying drawings. In the drawings.

DESCRIPTION OF THE PREFERRED EMBODIMENTS

Figure 1:
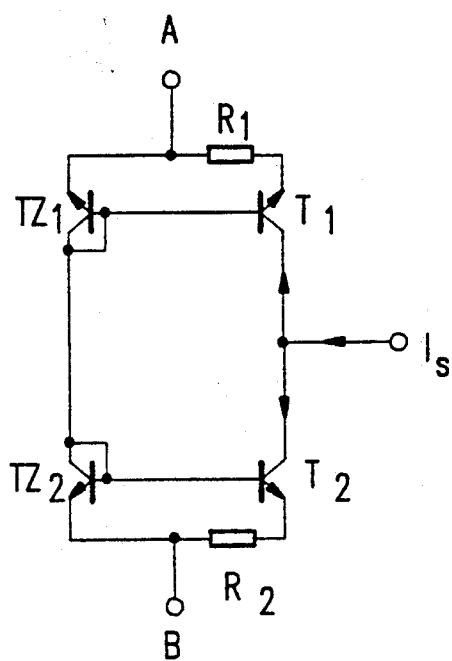
FIG. 1 shows a first embodiment of a limiter circuit in accordance with the invention.

The limiter circuit shown in FIG. 1 comprises two zener diodes arranged in series but in opposite sense, the diodes being formed by NPN transistors $TZ_1$ and $TZ_2$ which are diode-connected by interconnecting their respective bases and collectors. Consequently, each group comprises only one diode.

The limiter voltage is therefore constituted by the sum of the zener voltage of one of the two diode-connected transistors $TZ_1$ and $TZ_2$ and the forward voltage of the other diode-connected transistor $TZ_2$ and $TZ_1$ respectively.

This circuit is the actual limiter circuit. A signal current which indicates that a limiter current flows between A and B is derived in a current mirror formed by one of the two diode-connected transistors in combination with a further transistor, which current mirror reproduces the limiter current as a limiter signal current.

Such a current mirror is known per se, for example, from Tietze/Schenk: "Halbleiter-Schaltungstechnik", 8th edition, 1986, page 63.

The first transistors $TZ_1$ and $TZ_2$ are diode-connected (by a base-collector interconnection) and each form a respective current mirror with a respective second transistor $T_1$ and $T_2$ in that the bases and the emitters of each transistor pair $TZ_1$, $T_1$ and $TZ_2$, $T_2$, respectively are interconnected. A resistor, $R_1$ and $R_2$ respectively, is arranged in the emitter line of each of the further transistors $T_1$ and $T_2$ to adjust, i.e. to determine, the current-mirror ratio of the current mirror thus formed.

The collectors of the first transistors $TZ_1$ and $TZ_2$, which operate as zener diodes, are interconnected. Likewise, the collectors of the two further transistors $T_1$ and $T_2$ are interconnected.

The limiter circuit of this construction operates as follows. If point A is positive relative to point B and the applied voltage is larger than the sum of the zener voltage of the diode-connected transistor $TZ_1$ and the forward voltage of the diode-connected transistor $TZ_2$, a limiter current will flow, which current is reproduced in the collector line of the further transistor $T_2$ as a signal current in accordance with the selected ratio of the current mirror formed by the diode-connected transistor $TZ_2$ and the further transistor $T_2$. This signal current flows to point B via the further transistor $T_2$. Conversely, if point B is positive relative to point A and a limiter current flows, i.e. the applied voltage exceeds the sum of the zener voltage of the diode-connected transistor $TZ_2$ and the forward voltage of the diode-connected transistor $TZ_1$, the limiter current will be reproduced in the collector line of the further transistor $T_1$ with the selected ratio of the current mirror formed by the diode-connected transistor $TZ_1$ and the further transistor $T_1$. The reproduced current, which constitutes the limiter signal current, again flows in the same direction, this time to point A via the further transistor $T_1$.

This circuit thus enables a limiter signal current to be obtained which is decoupled from the limiter current, which is proportional to but an adjustable factor of the limiter current, for example, 1000 times smaller than this limiter current, and which always flows in the same direction independently of the instantaneous polarity of the alternating voltage applied to points A and B.

The current mirror ratio, i.e. the factor by which the limiter signal current $I_s$ is smaller than the limiter current, can be adjusted or set either by means of the resistors $R_1$ and $R_2$ in the emitter lines of the two further transistors $T_1$ and $T_2$ or by an appropriate choice of the (emitter/base) area ratio of the transistors $TZ_1$, $T_1$ and $TZ_2$, $T_2$ of each respective current mirror. The two resistors $R_1$ and $R_2$ at the same time prevent the two further transistors $T_1$ and $T_2$ from acting as zener diodes.

Figure 2:
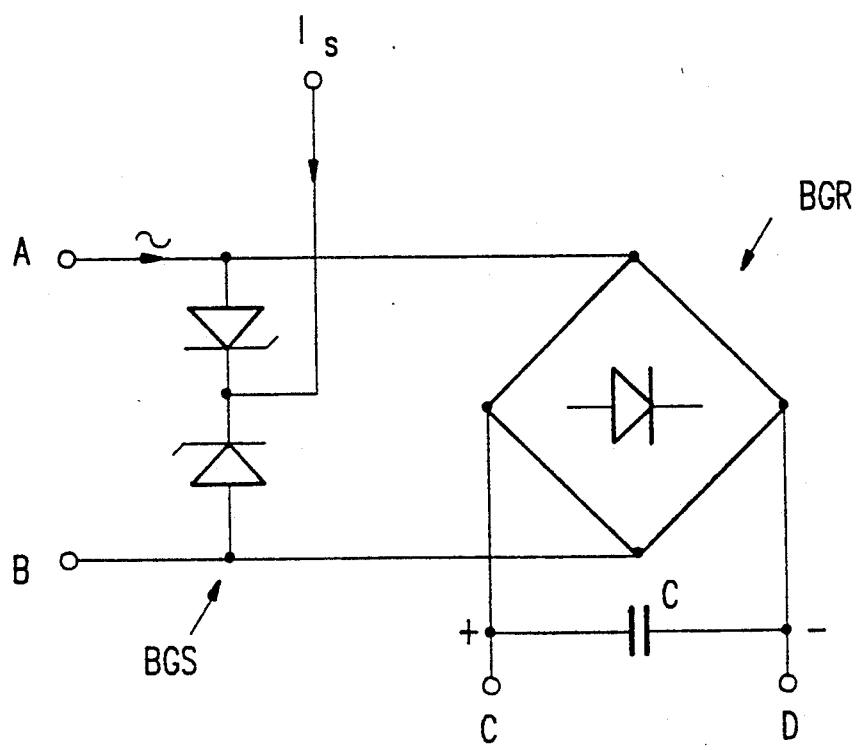
FIG. 2 illustrates diagrammatically the use of a limiter circuit in accordance with the invention in the input branch of a bridge rectifier.

FIG. 2 shows the use of a limiter circuit BGS as shown in FIG. 1 in the input branch of a bridge rectifier BGR. Such a circuit is employed, for example, in the input circuit of electronic telephone sets connected to two-wire lines in order to detect the arrival of a ringing current and to produce a ringing signal. When a ringing current appears on the line the applied voltage will exceed the preset limiter voltage and the limiter circuit BGS will be activated, i.e. a limiter signal current $I_s$ will flow which always has the same direction regardless of the instantaneous value of the alternating voltage. This limiter signal current $I_s$ can be employed for the production of a ringing signal in the electronic telephone set.

Figure 3:
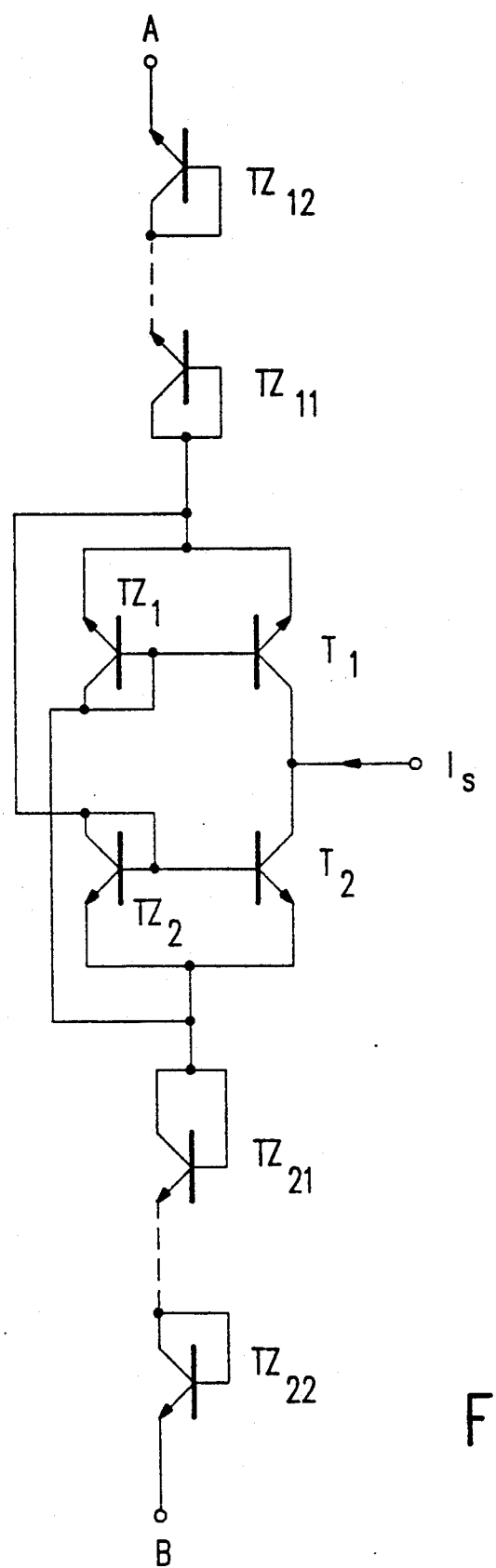
FIG. 3 shows a second embodiment of a limiter circuit in accordance with the invention.

FIG. 3 finally shows a further embodiment of a limiter circuit in accordance with the invention. In this case each of the groups of zener diodes comprises at least two diodes, namely $TZ_1$ and $TZ_{11}$ in the one group and $TZ_2$ and $TZ_{21}$ in the other group, of which each time one diode, i.e. $TZ_{11}$ in the one group and $TZ_{21}$ in the other group, should operate as a zener diode. In a manner similar to that shown in FIG. 1, the diodes $TZ_1$ and $TZ_2$, which need not necessarily operate as zener diodes, together with a respective further transistor $T_1$ or $T_2$ each form a current mirror, which reproduces a limiter current in the collector lines of the further transistors $T_1$ and $T_2$, as already described above with reference to FIG. 1, in such a way that it always flows in the same direction.

In this circuit the collectors of the diode-connected transistors $TZ_1$ and $TZ_2$ are not connected to each other but to the emitter of the respective other diode-connected transistor $TZ_2$ and $TZ_1$. In this circuit the limiter voltage is therefore given by the sum of the zener voltages of the diodes $TZ_{11}$ and $TZ_{12}$ and the forward voltages of the diodes $TZ_2$, $TZ_{21}$ and $TZ_{22}$ for one polarity of the applied alternating voltage and the sum of the zener voltages of the diodes $TZ_{21}$ and $TZ_{22}$ and the forward voltages of the diodes $TZ_1$, $TZ_{11}$ and $TZ_{12}$ for the other polarity.

In the current mirrors in this embodiment the current-mirror ratio is not adjusted by means of resistors arranged in the emitter lines of the further transistors $T_1$ and $T_2$ but by means of the emitter/base area ratio of the transistors $TZ_1$ and $T_1$ and of $TZ_2$ and $T_2$ respectively.

The circuit elements used in an integrated version of the limiter circuit in accordance with the invention may be replaced by equivalent elements in conformity with the fabrication method used for the fabrication of the integrated circuit. For example, the zener diodes used in the embodiment shown in FIG. 3 may be realised directly by diode structures instead of by transistor structures. Likewise, the conductivity types of the circuit elements may be reversed.

I claim:

1. A limiter circuit for alternating voltages, the circuit comprising a series arrangement of two diode groups, the groups being arranged in opposite se... and each group comprising at least one zener diode, characterized in that one zener diode of each comprises a diode-connected first transistor, which together with a respective further transistor forms a respective current mirror whereby a reproduced value of the limiter current flows through the further transistors to form a limiter signal current ($I_s$) which indicates the flow of a limit current in a zener diode.

2. A limiter circuit as claimed in claim 1, further comprising a connection between the collectors of the two further transistors for deriving the limiter signal current ($I_s$).

3. A limiter circuit as claimed in claim 2, wherein each group comprises only one diode-connected transistor operating as a zener diode and each of which includes a respective one of the first transistors, and wherein collectors of the two diode-connected transistors are interconnected.

4. A limiter circuit as claimed in claim 2, wherein each group comprises a plurality of zener diodes and with a collector of the first transistor of each group is connected to an emitter of the first transistor of the other group.

5. A limiter circuit as claimed in claim 1 wherein the current-mirror ratio of the current mirror is determined by a resistor connected in an emitter line of the further transistor.

6. A limiter circuit as claimed in claim 4, wherein the current-mirror ratio of the current mirror is determined by the emitter-base area ratio of the first and the second further transistors relative to each other.

7. A limiter circuit as claimed in claim 1 wherein the current-mirror ratio of the current mirror is chose such that the limiter signal current is of the order of magnitude of $10^{-6}$ A.

8. A signal circuit comprising a limiter circuit as claimed in claim 1 coupled to the alternating voltage input of a full-wave rectifier bridge.

9. A signal circuit as claimed in claim 8 wherein, the alternating voltage input of the rectifier bridge is connected to a two-wire telephone line and the limiter voltage of the limiter circuit is selected such that a limiter signal current ($I_s$) is produced when a ringing signal appears on the telephone line.

10. A limiter circuit as claimed in claim 2 wherein the current-mirror ratio of the current mirror is determined by a resistor connected in an emitter line of the further transistor.

11. A limiter circuit as claimed in claim 4 wherein the current-mirror ratio of the current mirror is chosen such that the limiter signal current is of the order of magnitude of $10^{-6}$A.

12. A limiter circuit as claimed in claim 1, wherein the current-mirror ratio of the current mirror is determined by the emitter-base area ratio of the first and the further transistors relative to each other.

13. A limiter circuit as claimed in claim 1, further comprising a connection line coupled to a junction point between said further transistors and to a signal terminal for passing a unidirectional limiter signal current through the signal terminal.

14. A limiter circuit for an alternating voltage comprising:

first and second input terminals for said alternating voltage, first and second diode-connected transistors connected in series opposition between said first and second input terminals to form a voltage limiter circuit wherein the first diode-connected transistor is operative as a zener diode for one polarity of the alternating voltage and the second diode-connected transistor is operative as a zener diode for the opposite polarity of the alternating voltage, first and second further transistors connected in series opposition between said first and second input terminals and coupled respectively to said first and second diode-connected transistors so as to form therewith first and second current mirrors, respectively, whereby a limiter signal current related to a limiter current flowing through the limiter circuit alteratively flows through said first and second further transistors as a function of the polarity of the alternating voltage, and a signal current terminal coupled to a junction of said first and second further transistors.

15. A limiter circuit as claimed in claim 14 further comprising third and fourth diode-connected transistors connected in series opposition in said limiter circuit and operative as zener diodes as a function of the polarity of the alternating voltage, and third and fourth diode-connected transistors being connected in series aiding with said first and second diode-connected transistors, respectively, and wherein the collector of the first diode-connected transistor is connected to the emitter of the second diode-connected transistor and vice versa whereby each of the first and second diode-connected transistors only pass a limiter current in its forward direction.

* * * * *